United States Patent
Zhao et al.

(10) Patent No.: US 11,018,668 B2
(45) Date of Patent: May 25, 2021

(54) CHARACTERIZATION OF POWER DELIVERY NETWORK IN FIELD PROGRAMMABLE GATE ARRAYS OR DIGITAL INTEGRATED CIRCUITS

(71) Applicants: Shuze Zhao, Toronto (CA); Olivier Trescases, Toronto (CA); Ibrahim Ahmed, Toronto (CA); Vaughn Betz, Toronto (CA); THE GOVERNING COUNCIL OF THE UNIVERSITY OF TORONTO, Toronto (CA)

(72) Inventors: Shuze Zhao, Toronto (CA); Olivier Trescases, Toronto (CA); Ibrahim Ahmed, Toronto (CA); Vaughn Betz, Toronto (CA)

(73) Assignees: Shuze ZHAO, Toronto (CA); Olivier TRESCASES, Toronto (CA); Ibrahim AHMED, Toronto (CA); Vaughn BETZ, Toronto (CA); The Governing Council of the University of Toronto, Toronto (CA)

( * ) Notice: Subject to any disclaimer, the term of this patent is extended or adjusted under 35 U.S.C. 154(b) by 0 days.

(21) Appl. No.: 16/190,987

(22) Filed: Nov. 14, 2018

(65) Prior Publication Data
US 2019/0165782 A1 May 30, 2019

Related U.S. Application Data

(60) Provisional application No. 62/586,076, filed on Nov. 14, 2017.

(51) Int. Cl.
*H03K 19/00* (2006.01)
*H03K 19/003* (2006.01)
(Continued)

(52) U.S. Cl.
CPC ....... *H03K 19/0005* (2013.01); *H03K 19/003* (2013.01); *H03M 1/12* (2013.01); *H03M 1/502* (2013.01); *H03M 7/165* (2013.01)

(58) Field of Classification Search
CPC .................................................. H03K 19/0005
(Continued)

(56) References Cited

U.S. PATENT DOCUMENTS 7,616,004 B1 * 11/2009 Schofield, III .......... G06F 11/24
324/522
7,627,398 B1 * 12/2009 Bennett ................... H04L 12/10
700/286

(Continued)

*Primary Examiner* — Adam D Houston
(74) *Attorney, Agent, or Firm* — Ware, Fressola, Maguire & Barber LLP

(57) ABSTRACT

Modern FPGAs operate at a core voltage around 1V and therefore even small voltage fluctuations can lead to timing violations and logic errors. The Power Delivery Network (PDN) between a power supply and the FPGA core must be carefully designed to achieve a low output impedance over a broad range of frequencies. The present disclosure describes two techniques for characterization of the PDN: 1) to extract the DC resistance in the power delivery path, and 2) to identify the high impedance frequency band(s) in the PDN. An embedded impedance extraction tool is synthesized within the FPGA load, in coordination with a mixed-signal current-mode dc-dc converter. A self-calibrated Carry-Chain based ADC (CC-ADC) is used for high-speed sampling of the core voltage. By modifying the PDN based on the extracted results, the voltage operating range and reliability of a crossbar application may be greatly extended.

19 Claims, 23 Drawing Sheets

(51) Int. Cl.
  *H03M 7/16*    (2006.01)
  *H03M 1/12*    (2006.01)
  *H03M 1/50*    (2006.01)

(58) Field of Classification Search
  USPC .......................................................... 327/551
  See application file for complete search history.

(56) References Cited

U.S. PATENT DOCUMENTS

| | | | |
|---|---|---|---|
| 9,973,102 B1* | 5/2018 | Vadhavkar | H02M 5/458 |
| 9,985,640 B1* | 5/2018 | Wen | H03M 1/1009 |
| 10,254,776 B1* | 4/2019 | Singleton | G05F 1/573 |
| 2014/0009200 A1* | 1/2014 | Kay | H03K 5/14 |
| | | | 327/281 |
| 2014/0055077 A1* | 2/2014 | Barrass | H02P 7/298 |
| | | | 318/700 |
| 2014/0079098 A1* | 3/2014 | Harjani | H04B 1/001 |
| | | | 375/219 |
| 2014/0368366 A1* | 12/2014 | Galton | H03M 3/386 |
| | | | 341/143 |
| 2015/0077280 A1* | 3/2015 | Park | H03M 1/38 |
| | | | 341/156 |
| 2017/0179817 A1* | 6/2017 | Gu | H02M 1/14 |
| 2018/0059191 A1* | 3/2018 | Abu Qahouq | G01R 31/392 |
| 2018/0175873 A1* | 6/2018 | Ramakrishnan | H03M 1/1042 |
| 2018/0183455 A1* | 6/2018 | Lee | H03M 1/0863 |
| 2018/0259402 A1* | 9/2018 | Ben-Yishay | G01K 15/005 |
| 2019/0165782 A1* | 5/2019 | Zhao | H03K 19/0005 |

* cited by examiner

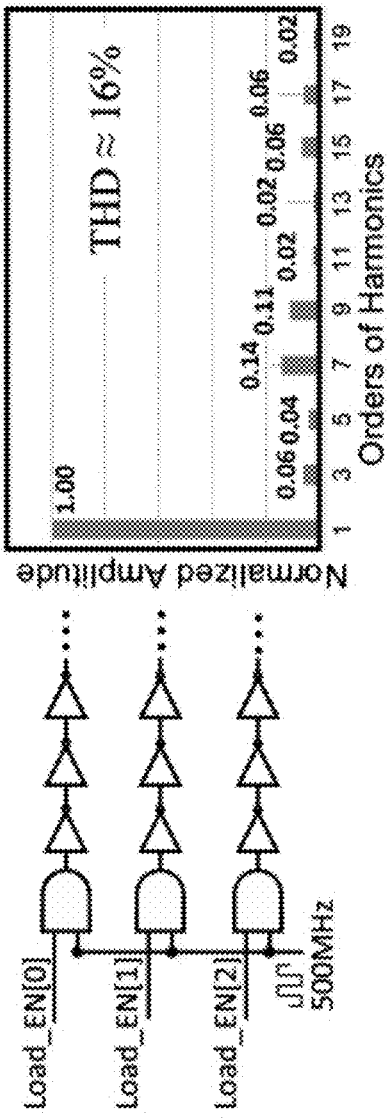
FIG. 8A
FIG. 8B
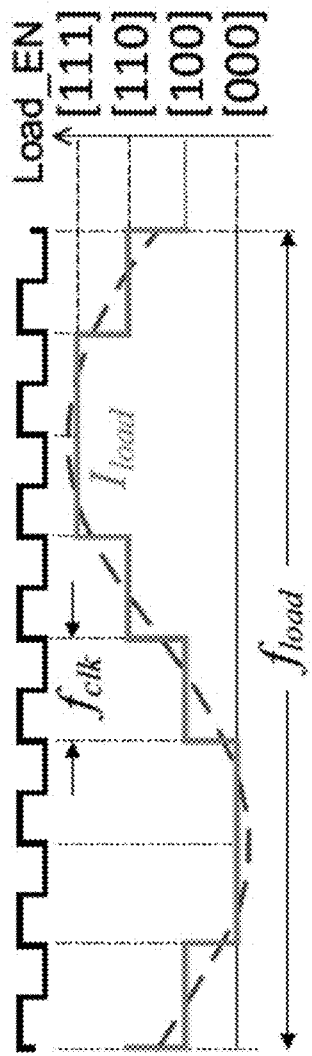
FIG. 8C

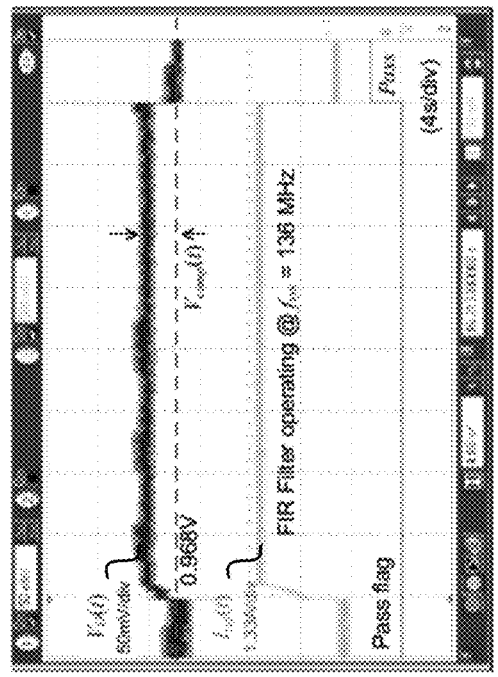
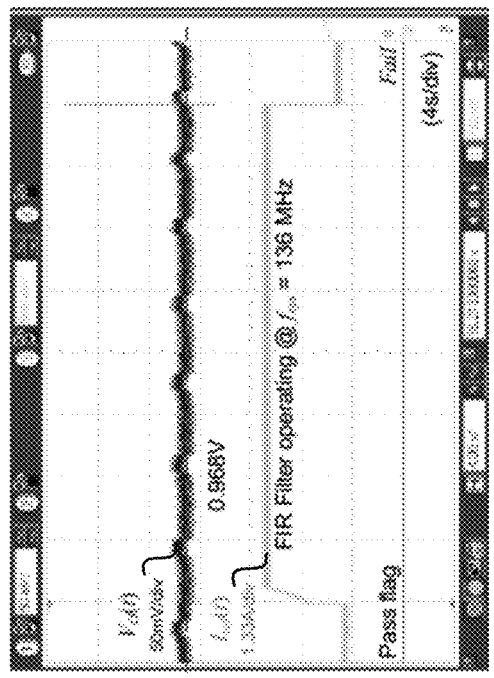
FIG. 12B
FIG. 12A

CHARACTERIZATION OF POWER DELIVERY NETWORK IN FIELD PROGRAMMABLE GATE ARRAYS OR DIGITAL INTEGRATED CIRCUITS

CROSS-REFERENCE TO RELATED APPLICATIONS

This application claims benefit to provisional application Ser. No. 62/586,076, filed 14 Nov. 2017, which is incorporated by reference in their entirety.

TECHNICAL FIELD

The present disclosure relates to characterization of a power delivery network in Field Programmable Gate Arrays (FPGAs) or digital integrated circuits, and in particular to frequency-domain power delivery network self-characterization in FPGAs or digital integrated circuits for improved system reliability.

BACKGROUND

Due to their ability to implement massively parallel algorithms, Field Programmable Gate Arrays (FPGAs) can outperform microprocessors and Digital Signal Processors (DSPs) in a growing number of applications, from high-speed networking interfaces, to CPU accelerators for machine learning and high-frequency stock trading. Hardware reconfigurability, a unique and powerful feature of FPGAs, enables a drastic reduction in the development time and cost of new digital systems. That flexibility inherently leads to unpredictable load current profiles, which raises unique challenges for the Power Delivery Network (PDN) design.

FIG. 1A shows a representation of a Power Delivery Network (PDN) for supplying power to an FPGA. The PDN 14 comprises several components and exists between the Voltage Regulator (VR) 12 and the FPGA core 10. Modern FPGAs are powered by a switched-mode VR, typically using a buck converter topology, that precisely regulates the FPGA core voltage. As shown in FIG. 1A, the small-signal closed-loop output impedance, as seen by the FPGA load, can be represented as $Z_{out}(s)=V_{core}/I_{load}(s)$. The impedance magnitude, $|Z_{out}|$, is extremely important because it dictates the relationship between the load current, $I_{load}$, and the resulting core voltage, $V_{core}$. Modern FPGAs operate at low core voltages and therefore even small voltage fluctuations cause significant delay variations that can lead to timing violations in the digital circuits. FPGAs also draw a high current and often have fast load transients that are unique for each programmed application; therefore the power-stage must provide a low impedance over a wide range of frequencies to guarantee error-free operation.

While the load current spectrum is notoriously difficult to predict due to its data-dependent nature, certain designs may include logic that cause voltage drops large enough to cause logic errors, such as reset modes that trigger near a resonant frequency of the PDN. If the current amplitude is sufficiently high, this may lead to under-voltage lock-out or over-voltage on the FPGA and could even permanently damage the chip. One problem associated with this voltage vulnerability is that FPGAs are being deployed as accelerators into both private and public server environments, and therefore it could allow Denial-of-Service (DoS) attacks on cloud-based FPGAs through malicious code that can crash the server via under-voltage faults.

The output impedance, $Z_{out}(s)$, can be separated into two components. This is shown in FIG. 2, which shows a representation of output impedance magnitude, $|Z_{out}|$, of an FPGA board as a function of frequency.

At low frequencies, typically below one-tenth of the switching frequency ($f_s$) of the dc-dc converter, $Z_{out}$ is dominated by the regulation performance of the dc-dc converter. The power converter topology, the operating point, and the frequency response of the voltage-loop compensator dictate $Z_{out}$ in this low-frequency region. Note that for very low frequencies, well within the control bandwidth of the dc-dc converter, the ideal output impedance $Z_{out}$ should be zero, meaning that the FPGA core voltage is well regulated by the power-stage controller; however, due to the PDN DC resistance, the resistance between the off-chip voltage feedback point and the FPGA die, $R_{PDN}$, the on-chip supply voltage shifts with the load current and therefore $Z_{out} \approx R_{PDN}$ at very low frequencies.

At high frequencies, beyond the control loop bandwidth of the dc-dc converter, $Z_{out}$ is dictated by the PDN AC impedance, $Z_{PDN}$, i.e., the passive decoupling components and their parasitic elements. Note that as shown in FIG. 1A, the PDN 14 which connects the VR 12 to the load circuits of the FPGA 10 contains both an on-chip 14a and off-chip 14b component. The off-chip component usually determines $Z_{PDN}$ up to tens of MHz, and the impedance at higher frequencies is dominated by the on-chip PDN.

As shown in FIG. 1A, the off-chip PDN 14b mostly depends on the PCB design and off-chip passive components, along with their associated parasitic elements. The passive components are used to filter the switching noise from the VR 12, while also providing wide-band voltage decoupling near the FPGA's core. The on-chip component 14a mainly consists of bond-wire inductance (in the case of wire-bonded packages) as well as routing resistance and capacitance.

FIG. 1B shows a simulated impedance contribution of components of the PDN of FIG. 1A. In FIG. 1B, the PDN impedance magnitude, $|Z_{PDN}|$, is simulated with an Intel FP-GA PDN Design Tool, as different groups of components are removed one by one to illustrate their impact. The simulation parameters are listed in Table 1 below. Line 52 shows the magnitude of the PDN AC impendence, $|Z_{PDN}|$, as a function of frequency with all components. Line 54 shows the magnitude of the PDN AC impendence, $|Z_{PDN}|$, as a function of frequency with the spreading removed. Line 56 shows the magnitude of the PDN AC impendence, $|Z_{PDN}|$, as a function of frequency with the PCB plane removed. Line 58 shows the magnitude of the PDN AC impendence, $|Z_{PDN}|$, as a function of frequency with a 8×10 nF capacitor removed. Line 60 shows the magnitude of the PDN AC impendence, $|Z_{PDN}|$, as a function of frequency with a 10×22 nF capacitor removed. Line 62 shows the magnitude of the PDN AC impendence, $|Z_{PDN}|$, as a function of frequency with a 14×0.1 µF capacitor removed. Line 64 shows the magnitude of the PDN AC impendence, $|Z_{PDN}|$, as a function of frequency with a 8×0.47 µF capacitor removed.

TABLE 1

| Components | Count | Parameters |
| --- | --- | --- |
| 1. spreading & BGA | 1 | 0.513 mΩ, 0.0166 nH |
| 2. PCB plane | 1 | 1.7 mΩ, 6.6 nF |
| 3-6. capacitors | 8 | 10 nF, 60 mΩ, 0.4 nH, 0402 |
|  | 10 | 22 nF, 43 mΩ, 0.4 nH, 0402 |

TABLE 1-continued

| Components | Count | Parameters |
|---|---|---|
| | 14 | 0.1 µF, 28 mΩ, 0.4 nH, 0402 |
| | 8 | 0.47 µF, 16 mΩ, 0.4 nH, 0402 |
| | 1 | 10 µF, 190 mΩ, 3.7 nH, 1206 |
| | 2 | 47 µF, 140 mΩ, 3.7 nH, 1206 |
| | 1 | 330 µF, 20 mΩ, 4 nH, 1210 |
| PCB routing | 1 | 2 mΩ, 2 nH |

The design of the off-chip PDN (i.e. on the PCB) is usually based on 1) the dc-dc converter requirements for stable operation, and 2) the load dynamic requirements, where the design must typically satisfy a maximum $|Z_{PDN}|$ over a determined frequency range (including DC). Simulation tools are often used to estimate $|Z_{PDN}|$, however they have a number of important limitations. For example, simulation tools rely on the designer's knowledge of the passive component values and their associated parasitic elements; however the precise value of parasitic elements is seldom provided by the manufacturers. Further, in the context of mass-produced PCBs, the component variation for the capacitors and inductors can range from several percent up to 20%, especially considering the wide temperature range of industrial applications. The component variation typically gets worse over time due to aging. The PCB routing's contribution to $Z_{PDN}$ is also usually ignored, since conventional PCB design tools do not have built-in capability to perform lumped element extraction of the routing impedance, which is a fairly involved process. However, as the supply voltage is reduced and the on-board current density is increased, the contribution of the PCB routing to $Z_{PDN}$ becomes increasingly important. Still further, the AC component of the on-chip PDN impedance, which is mainly set by the bond-wires (<10 nH), is only significant in the hundreds of MHz, hence it is usually ignored in the simulation. However, the DC resistance from the bond-wires and the power distribution grid does contribute to $Z_{PDN}$ and cannot be neglected.

In order to deal with the aforementioned limitations, designers must rely on experimental measurement of $|Z_{PDN}|$, which requires use of expensive equipment such as a network analyzer to tune and iterate the PDN design. This, however, does not cover the aging effect, component variation and manufacturing imperfections across multiple PCBs.

Accordingly, systems and methods that enable additional, alternative, and/or improved characterization of the PDN in FPGAs remain highly desirable.

BRIEF DESCRIPTION OF THE DRAWINGS

Further features and advantages of the present disclosure will become apparent from the following detailed description, taken in combination with the appended drawings, in which:

FIGS. 8A-C respectively show a representation of programmable load cell circuitry, harmonics of ideal $I_{load}$, and the timing of an enable signal, during PDN characterization;

FIGS. 12A and 12B respectively show a representation of FIR Filter operation with logic errors due to IR-drop and without error due to IR-drop compensation;

It will be noted that throughout the appended drawings, like features are identified by like reference numerals.

SUMMARY

Figure 1A:
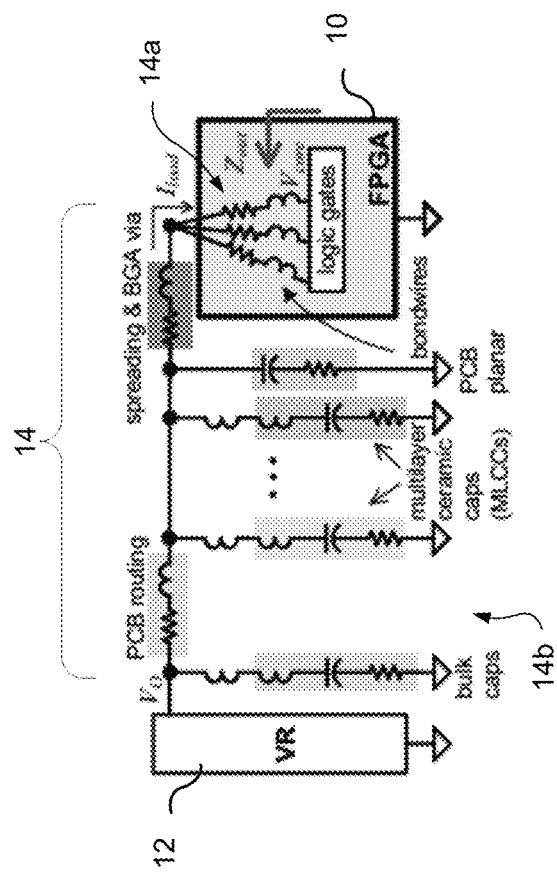
FIG. 1A shows a representation of a Power Delivery Network (PDN) for supplying power to an FPGA.
Figure 1B:
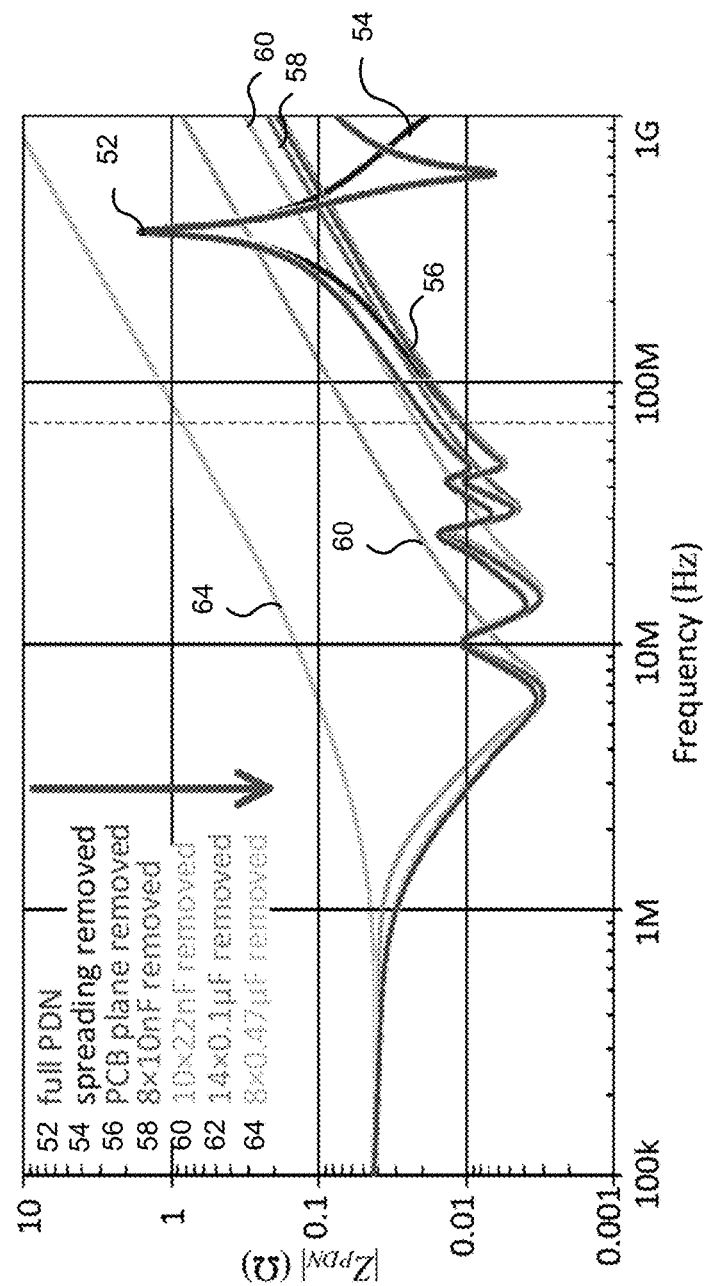
FIG. 1B shows a simulated impedance contribution of components of the PDN of FIG. 1A.
Figure 2:
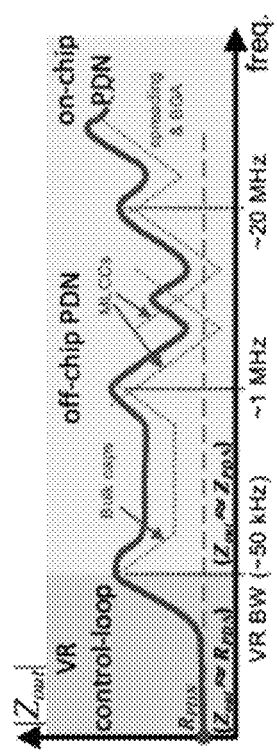
FIG. 2 shows a representation of output impedance magnitude, $|Z_{out}|$, of an FPGA board as a function of frequency.

A method of determining an impedance of a Power Delivery Network (PDN) of a Field-Programmable Gate Array (FPGA) is disclosed. The method comprises performing a calibration of a Carry-Chain Analog-to-Digital Converter (CC-ADC) to calibrate an output of the CC-ADC to correspond with a core voltage of the FPGA; controlling one or more programmable loads on the FPGA such that a current draw in the CC-ADC is approximately sinusoidal at a first frequency; recording a minimum and a maximum output of the CC-ADC at the first frequency; determining a minimum and a maximum core voltage based on the minimum and the maximum output of the CC-ADC in accordance with the calibration; and calculating a voltage ripple based on the difference between the maximum core voltage and the minimum core voltage, wherein the voltage ripple approximates the impedance of the PDN at the first frequency.

The method may further comprise outputting the voltage ripple at the first frequency.

The method may further comprise controlling the one or more programmable loads such that the current draw in the CC-ADC is approximately sinusoidal at one or more additional frequencies, each of the additional frequencies greater than the first frequency and less than or equal to a predetermined maximum frequency; and at each respective frequency of the one or more additional frequencies, the method further comprises: recording a minimum and a maximum output of the CC-ADC at the respective frequency; determining a minimum and a maximum core voltage at the respective frequency based on the minimum and the maximum output of the CC-ADC in accordance with the calibration; and determining a voltage ripple at the respective frequency based on the difference between the maximum core voltage and the minimum core voltage.

The method may further comprise outputting the voltage ripple at each of the one or more additional frequencies.

In the method, the sampling frequency of the CC-ADC may be at least 8 to 10 times of the predetermined maximum frequency.

In the method, the calibration of the CC-ADC may be performed using a bandgap reference of an external voltage sensing.

In the method, the output of the CC-ADC may be in binary.

In the method, the CC-ADC may comprise an encoder to encode a thermometer code output into binary.

A system for determining an impedance of a Power Delivery Network (PDN) of a Field-Programmable Gate Array (FPGA) is disclosed. The system comprises a Carry-Chain Analog-to-Digital Converter (CC-ADC), comprising: a plurality of carry-chain adders configured to receive a modulating input; and an encoder configured to encode an output of the carry-chain adders into binary; one or more programmable loads; and a frequency generator configured to control the one or more programmable loads so that a current draw of the CC-ADC is sinusoidal at a plurality of frequencies.

In the system, the CC-ADC and the one or more programmable loads may be disposed on the FPGA during testing.

In the system, the CC-ADC may be implemented as a line of logical elements on the FPGA.

In the system, the one or more programmable loads may be disposed around the CC-ADC.

In the system, the CC-ADC may comprise 256 adders.

In the system, the CC-ADC may comprise an encoder to encode a thermometer code output into binary.

In the system, the one or more programmable loads may each comprise three inverter chains, each inverter chain configured to be controlled with an enable signal from the frequency generator.

The foregoing presents a simplified summary of the invention in order to provide a basic understanding of some aspects of the invention. This summary is not an exhaustive overview of the invention. It is not intended to identify essential, key or critical elements of the invention or to delineate the scope of the invention. Its sole purpose is to present some concepts in a simplified form as a prelude to the more detailed description that is discussed later. Other aspects of the invention are described below in relation to the accompanying drawings.

DETAILED DESCRIPTION

The present disclosure describes two stand-alone in-situ methods for characterizing the PDN DC resistance and AC impedance of an FPGA board, respectively. The proposed schemes are highly automated and require minimal user effort. The proposed schemes take advantage of the programmable logic in the FPGA and only require a programmable dc-dc power-stage to assist the measurement. Both methods are intended to run on the FPGA board production-line for quality control, or in the field for end-users to evaluate the PCB operation. The proposed methods can extract $R_{PDN}$, the DC resistance in the power delivery path, and also indicate frequency band(s) with high impedance due to a poor PDN ($Z_{out}$). These results provide insights on the PDN: high $R_{PDN}$ indicates poor power path layout on the PCB or soldering imperfection at the power pins; high impedance peak(s) indicates poor decoupling network design at certain frequencies, component failures or soldering imperfection. Manufacturers and end-users can use the information to correct their simulation model, detect damaged components or soldering imperfections and optimize the PCB design, thereby improving the product yield and system reliability.

As will be further described herein, one of the features of the present disclosure includes a new Carry-Chain based ADC (CC-ADC) that is introduced for the on-chip voltage measurement, which has significantly improved sampling frequency that is critical for high-frequency voltage measurements. Another feature includes a self-measurement scheme is proposed that can leverage the improved on-chip ADC to automatically characterize the PDN across a range of frequencies. The measurements are compared with the simulation results to demonstrate the effectiveness of the proposed scheme. In addition, a common application, a crossbar switch, is used to demonstrate logic failure due to a poor PDN design. The board-level PDN improvements extend the safe operation zone for the application. These and other features will be described herein.

Embodiments are described below, by way of example only, with reference to FIGS. 3-22.

Figure 3:
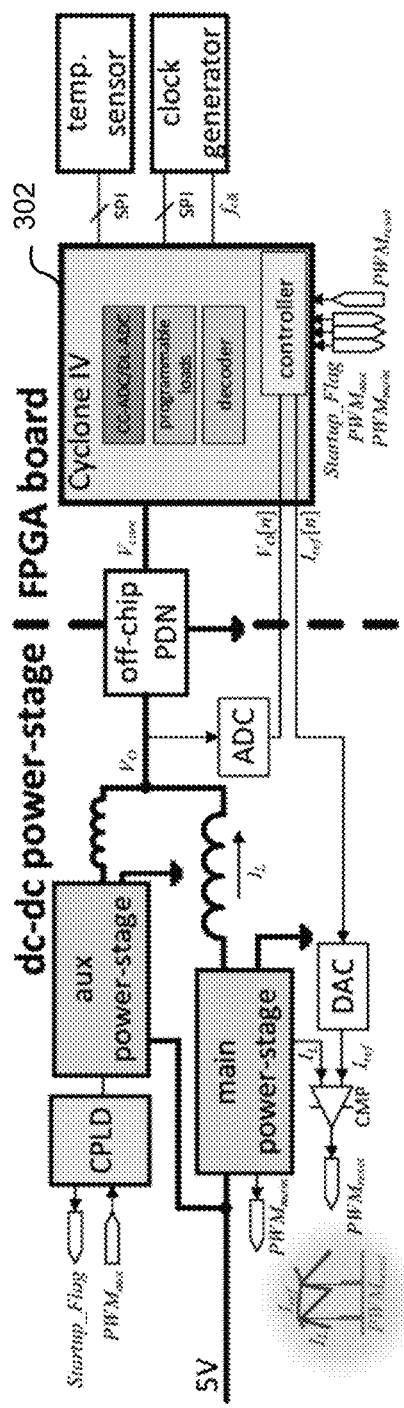
FIG. 3 shows a representation of system-level architecture of the PDN in accordance with a PDN self-characterization scheme.

FIG. 3 shows a representation of system-level architecture of the PDN in accordance with a PDN self-characterization scheme. The system-level architecture may be used for both the DC resistance extraction and AC impedance characterization schemes. The FPGA 302 is powered by a two-phase buck converter. The main phase uses the Enpirion ET4040QI power-stage module. During startup, the Complex Programmable Logic Device (CPLD) controls the auxiliary phase to power up the FPGA, until the FPGA is configured. After this step, the FPGA-based digital dc-dc controller takes over the control of the main phase and disables the auxiliary phase. The main phase operates in mixed-signal peak current mode control. The digital peak current command, $I_{ref}[n]$, is calculated on the FPGA and sent to the power-stage DAC.

Figure 4:
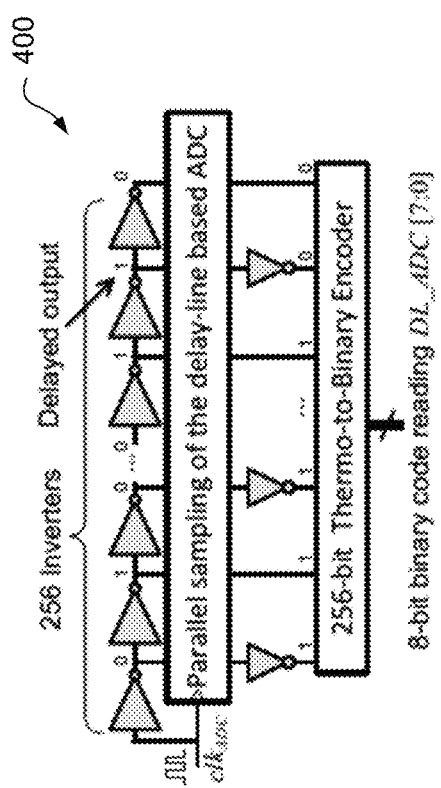
FIG. 4 shows a simplified representation of Delay Line Analog-to-Digital Converter (DL-ADC) architecture used for core voltage measurement during DC resistance extraction.

FIG. 4 shows a simplified representation of Delay Line Analog-to-Digital Converter (DL-ADC) architecture used for core voltage measurement during DC resistance extraction. Most FPGAs do not have direct pin-level access to the distributed on-chip core voltage, $V_{core}$. Even with remote sensing pins, the voltage at the particular location where the critical path is synthesized may be unable to be measured. DL-ADCs are advantageous due their attractive trade-off between power, area, and linearity. The 8-bit DL-ADC 400 depicted in FIG. 4 comprises a chain of 256 inverters and can be placed in any location of interest on the FPGA. The inverter outputs are continuously sampled by a set of registers fed by $clk_{ADC}$, which also drives the input of the first inverter.

Due to the voltage-dependent delay, the propagation depth, in terms of the number of logic elements, of the input clock pulse can be used to measure the supply voltage. The thermometer code output of the delay-line is encoded into binary, such that DL_ADC[n] is a digital representation of $V_{core}$.

Figure 5:
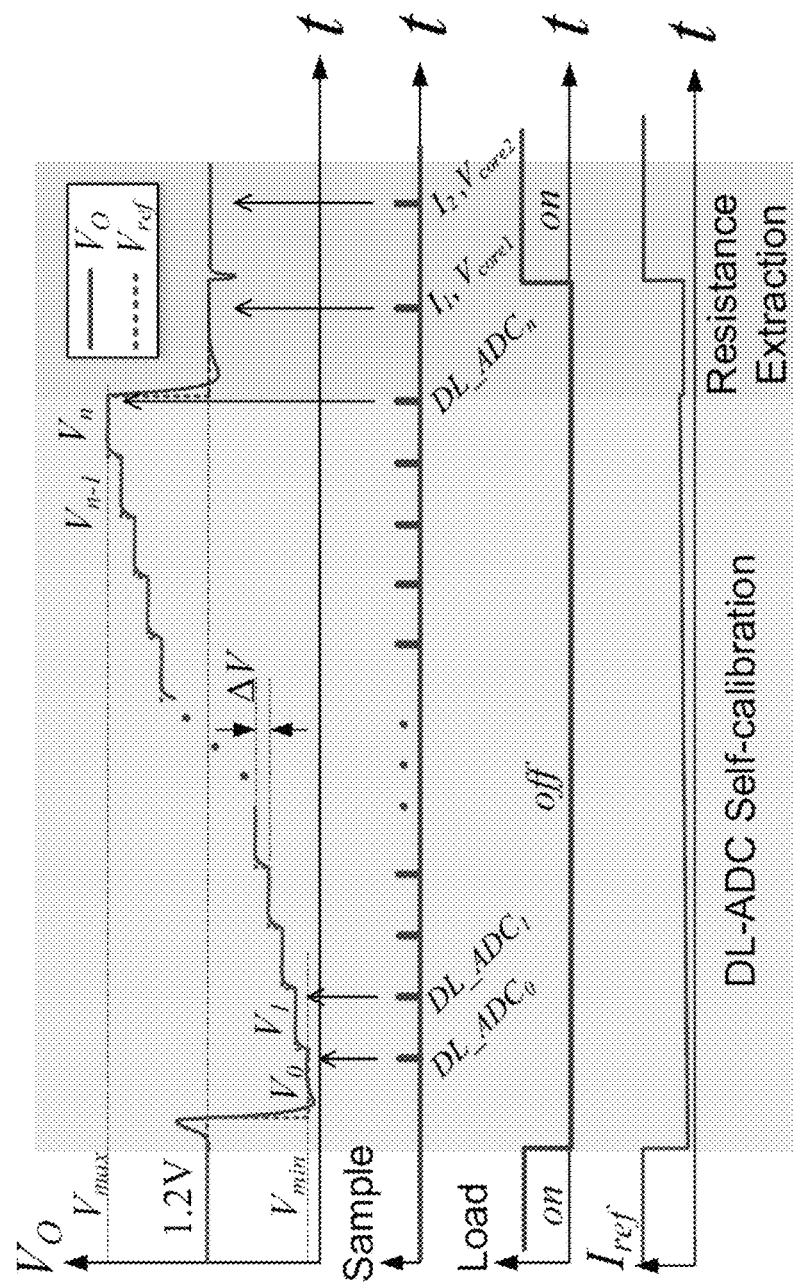
FIG. 5 shows a representation of ideal waveforms for the DL-ADC self-calibration and DC resistance extraction processes.

FIG. 5 shows a representation of ideal waveforms for the DL-ADC self-calibration and DC resistance extraction processes. The DC resistance extraction scheme allows for accurate measurement of the complete PDN resistance, $R_{PDN}$, from the VR feedback node to a specific location on-die. The DC resistance extraction process comprises two steps, as outlined below.

A DL-ADC self-calibration step is used to calibrate the DL-ADC, and to build a one-to-one relationship between the core voltage, $V_{core}$, and DL_ADC[n], which is inherently non-linear. Non-relevant circuits are turned off to reduce the on-chip current draw (hence $V_{core} \approx V_O$, where $V_O$ is the converter output voltage), and a full sweep of $V_O$ begins. For example, in FIG. 5 $V_O$ is first reduced to 0.896 V from 1.2 V and then increases by $\Delta V=8$ mV in each step, however other calibration parameters are possible for performing the full sweep of $V_O$ without departing from the scope of this disclosure. The DL-ADC sample, DL_ADC[n], is stored in memory until $V_O$ reaches a pre-determined value, such as 1.304 V. Once the sweep is complete, $V_O$ returns to the nominal voltage value, for example 1.2 V. As a result of the calibration, DL_ADC[n] can be used to accurately sense $V_{core}$.

A second step comprises a step for extraction of the DC resistance of the PDN. The FPGA then records the two peak current commands $I_{ref1}[n]$, $I_{ref2}[n]$, and two DL-ADC readings $DL\_ADC_1[n]$, $DL\_ADC_2[n]$, when the programmable loads are turned off and on, respectively, at $V_O=1.2$ V. The programmable loads are essentially arrays of generic logic gates clocked at a high-frequency to consume current. Referring to the self-calibration results, $DL\_ADC_1[n]$, $DL\_ADC_2[n]$ corresponds to $V_{core1}$ and $V_{core2}$, while $I_1$ and $I_2$ correspond to $I_{ref1}[n]$ and $I_{ref2}[n]$, respectively. The resistance of the PDN may then be calculated as given by equation (1).

$$R_{PDN} = \left| \frac{V_{core2} - V_{core1}}{I_2 - I_1} \right| \quad (1)$$

The ADC calibration and resistance extraction process is completed within tens of microseconds, limited only by the dc-dc converter dynamics. The die temperature is considered constant within the resistance extraction process and therefore does not affect the accuracy of the DL-ADC.

Since $R_{PDN}$ dictates the resistive voltage drop (IR-drop) from the voltage sensing point to the FPGA die, causing the on-chip supply voltage to shift with the load current, it can be used in the real-time IR-drop compensation for the Dynamic Voltage Scaling (DVS) operation as well. The IR-drop, $V_{IR}$, may be calculated in accordance with equation (2).

$$V_{IR} = I_{ref} \times R_{PDN} \quad (2)$$

A compensation voltage, $V_{comp} = V_{IR}$, can thus be implemented in the power-stage controller to build an IR-drop-aware power supply. This functionality is further described with reference to FIG. 12.

Figure 6:
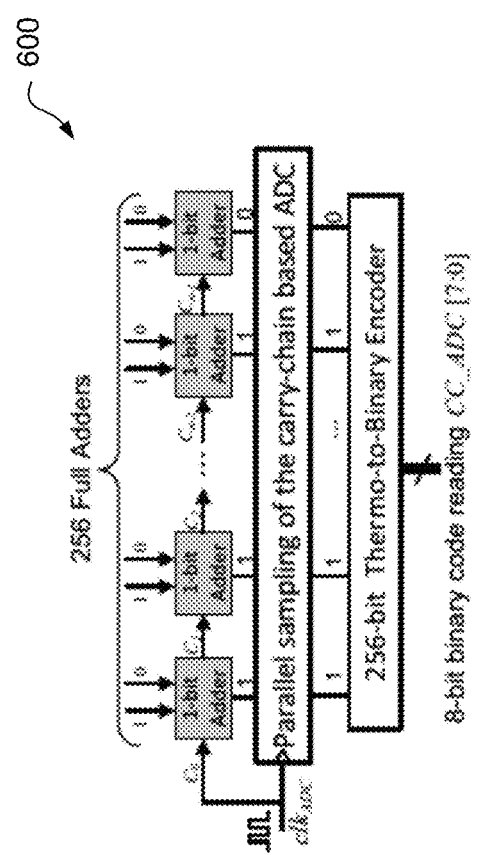
FIG. 6 shows a simplified representation of Carry-Chain Analog-to-Digital Converter (CC-ADC) architecture used for core voltage measurement during AC impedance extraction.

FIG. 6 shows a simplified representation of Carry-Chain Analog-to-Digital Converter (CC-ADC) architecture used for core voltage measurement during AC impedance characterization. The AC impedance characterization process requires fast and precise on-chip voltage measurement and therefore the conventional DL-ADC is not suitable. The 8-bit CC-ADC 600 shown in FIG. 6 comprises a chain of 256 carry-chain adders. The thermometer code output of the adders is encoded into binary, such that CC_ADC[7:0] is a digital representation of $V_{core}$.

The carry-chain hardware on the FPGA is used in the implementation of the ADC due to its optimized low propagation delay, which allows a much faster sampling rate at 75 MHz, compared to 10 MHz for the DL-ADC at a similar resolution of 4 mV/bit. Note that the effect of the on-chip portion of the PDN is typically observed beyond a hundred MHz, well beyond the sampling frequency band of the CC-ADC. There is a trade-off between the sampling frequency and the resolution for both DL-ADC and CC-ADC; therefore the sampling frequencies are compared at the predefined 4 mV/bit resolution. The use of the CC-ADC architecture constrains its location on chip, since the carry-chain has to be implemented using logic elements in a straight line to utilize the fast dedicated routing path. This is not a limitation when used for off-chip PDN characterization, as in the AC impedance characterization. However, for the DC resistance extraction, DL-ADC is the better candidate since it can be flexibly placed in any location on chip to measure the location specific resistance.

Figure 7:
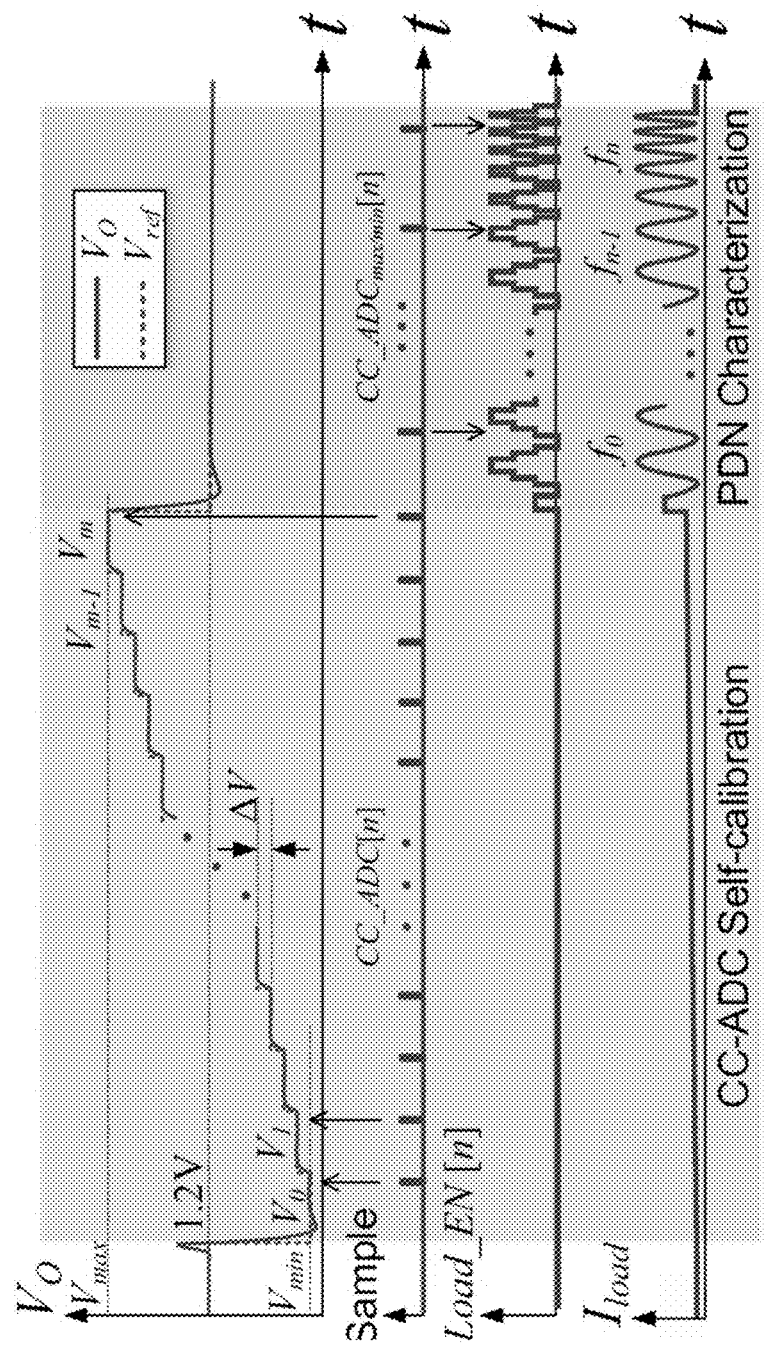
FIG. 7 shows a representation of ideal waveforms for the CC-ADC self-calibration and AC impedance extraction processes.

FIG. 7 shows a representation of ideal waveforms for the CC-ADC self-calibration and AC impedance extraction processes. The AC impedance characterization scheme allows for accurate measurement of a peak-to-peak voltage ripple, $\Delta V_{core}$, on-chip over a wide frequency range. The AC impedance characterization process comprises two steps, as outlined below.

A CC-ADC self-calibration step is used to calibrate the CC-ADC, and to build a one-to-one relationship between the core voltage, $V_{core}$, and CC_ADC[n], such that CC_ADC[n] can be used to accurately represent $V_{core}$. The on-chip voltage sensing may be calibrated using the bandgap reference of the external voltage sensing, which is commonly integrated within a power management IC.

A second step comprises a step for characterization of the PDN impedance. The frequency generator controls the programmable loads such that the resulting current draw is nearly sinusoidal, with a modulation frequency of $f_{load}$. The modulation frequency $f_{load}$ starts from a low frequency, $f_0$. The FPGA then records the minimum and maximum CC-ADC readings, $CC\_ADC_{min}[n]$ and $CC\_ADC_{max}[n]$, respectively, that result from this current perturbation. The CC-ADC readings $CC\_ADC_{min}[n]$ and $CC\_ADC_{max}[n]$ corresponds to the minimum and maximum core voltage, $V_{core\_min}$ and $V_{core\_max}$, and the delta voltage, $\Delta V_{core} = V_{core\_max} - V_{core\_min}$, indicates the on-chip voltage ripple. The voltage ripple indicated by $\Delta V_{core}$ is thus proportional to the amplitude of the complex impedance, $|Z_{PDN}|$, at $f_0$. The frequency generator then increases $f_{load}$ to $f_1$ and the measurement is repeated, until reaching $f_n$. The maximum frequency, $f_n$, is constrained by the sampling frequency of the CC-ADC; the CC-ADC sampling frequency should be at least 8 to 10 times higher than $f_n$ to ensure the voltage peaks are recorded.

FIGS. 8A-C respectively show a representation of programmable load cell circuitry, harmonics of ideal $I_{load}$, and the timing of an enable signal, during PDN characterization.

The detailed programmable load circuitry is shown in FIG. 8A. Each programmable load cell consists of three inverter chains, each of which is controlled with an enable signal, Load_EN[n]. In an exemplary embodiment, there may be 400 programmable load cells implemented, and they are grouped to 8 load modules. The timing of the enable signal Load_EN[n] is shown in FIG. 8C. The inverter chains are enabled at a higher frequency $f_{clk}$, such that the current drawn in the cells is near-sinusoidal at $f_{load}$. The harmonic content of ideal current $I_{load}$ is shown in FIG. 8B, resulting in a THD of 16%, leading to a reasonable approximation of sinusoidal perturbation as seen in FIG. 8C.

Experimental results obtained from the DC resistance extraction and AC impedance characterization schemes are described below. The FPGA platform in the experimental results is based on a DE2-115 evaluation board with a customized power-stage.

Figure 9:
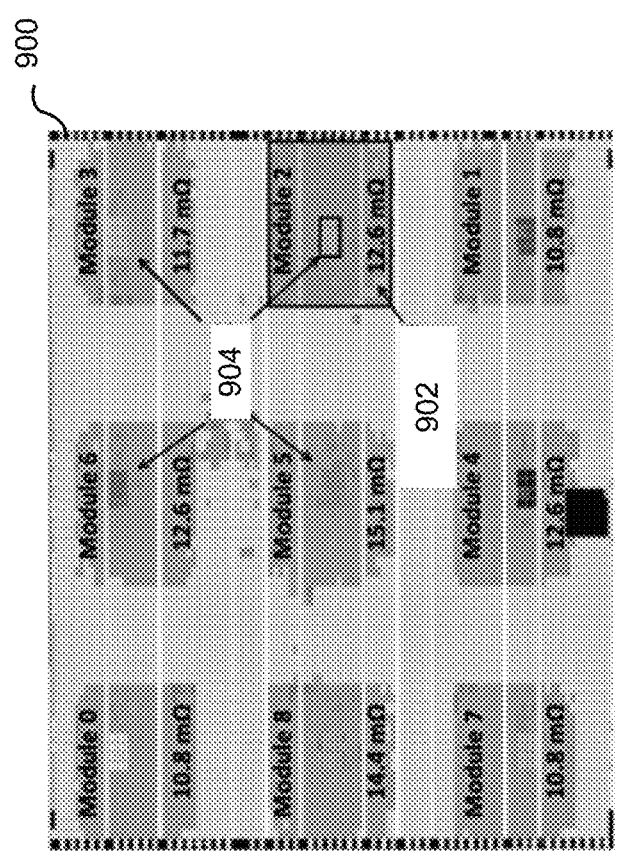
FIG. 9 shows an Intel FPGA Chip Planner view of nine test modules, each consisting of a DL-ADC and programmable load pair.

FIG. 9 shows an Intel FPGA Chip Planner view of nine test modules, each consisting of a DL-ADC and programmable load pair. The nine modules are synthesized in a chip 900 around the grid to extract $R_{PDN}$ at different locations in order to account for on-chip PDN resistance variation. The chip comprises a plurality of logical elements, some of which correspond to programmable loads 902 (only labelled with reference to module 2 but applies to all modules) and DL-ADCs 904 (only labelled with reference to modules 2, 3, 5, and 6 but applies to all modules). Other logical elements outside of the modules are unused.

Figure 10:
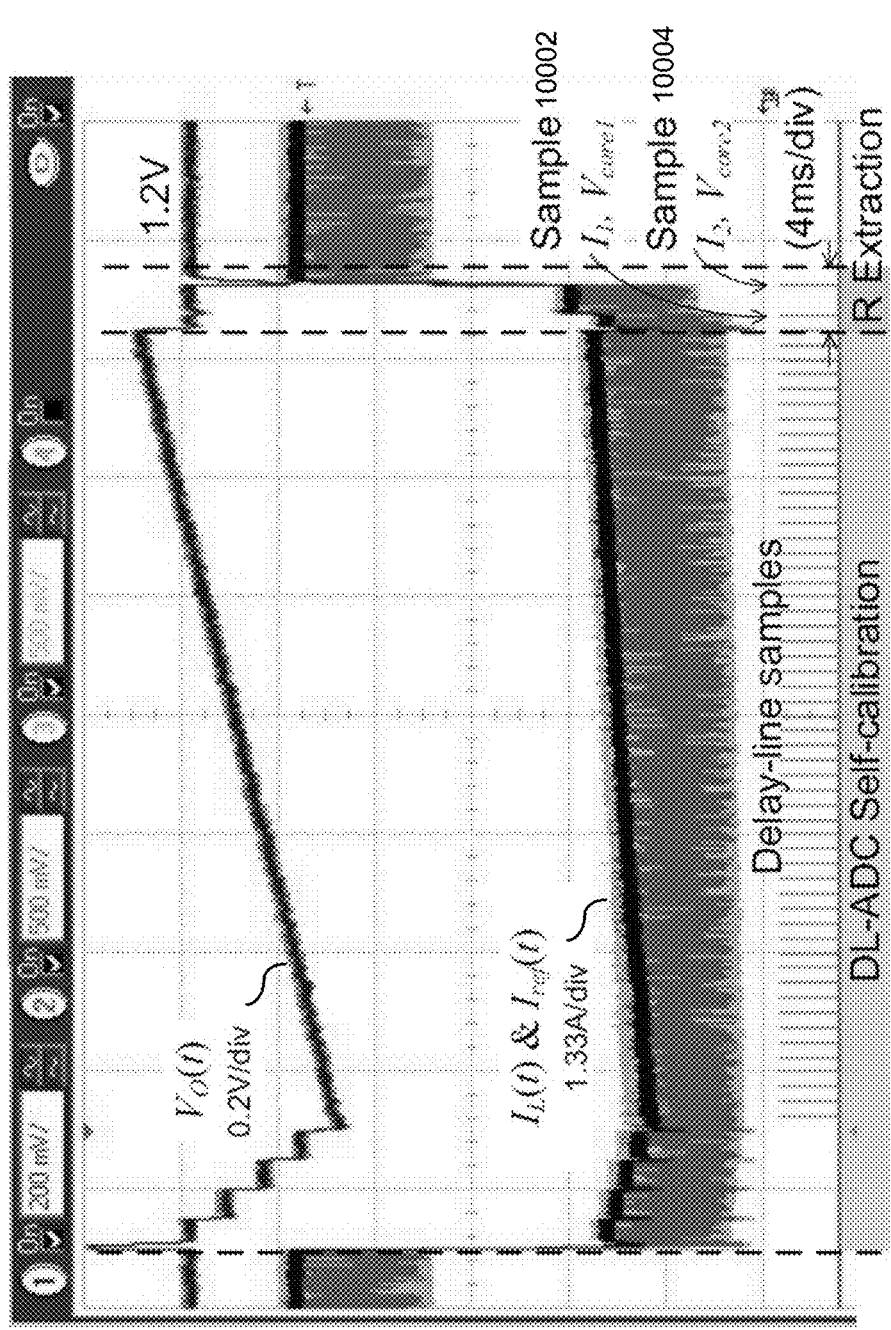
FIG. 10 shows a representation of one sweep of $V_{core}$ for DL-ADC self-calibration and resistance extraction in module 5 of the test modules of FIG. 9.

FIG. 10 shows a representation of one sweep of $V_{core}$ for DL-ADC self-calibration and resistance extraction in module 5 of the test modules of FIG. 9. The core voltage, $V_{core}$, is sampled by the DL-ADC and output as $DL\_ADC_n$ before $V_O$ increases by $\Delta V=8$ mV. The digital signal samples, e.g., sample 10002 and 10004, indicates the sampling point. When $V_O$ reaches the target voltage of 1.3 V, the ADC samples the last point, $DL\_ADC_{51}$ and $V_O$ returns to 1.2 V.

Figure 11:
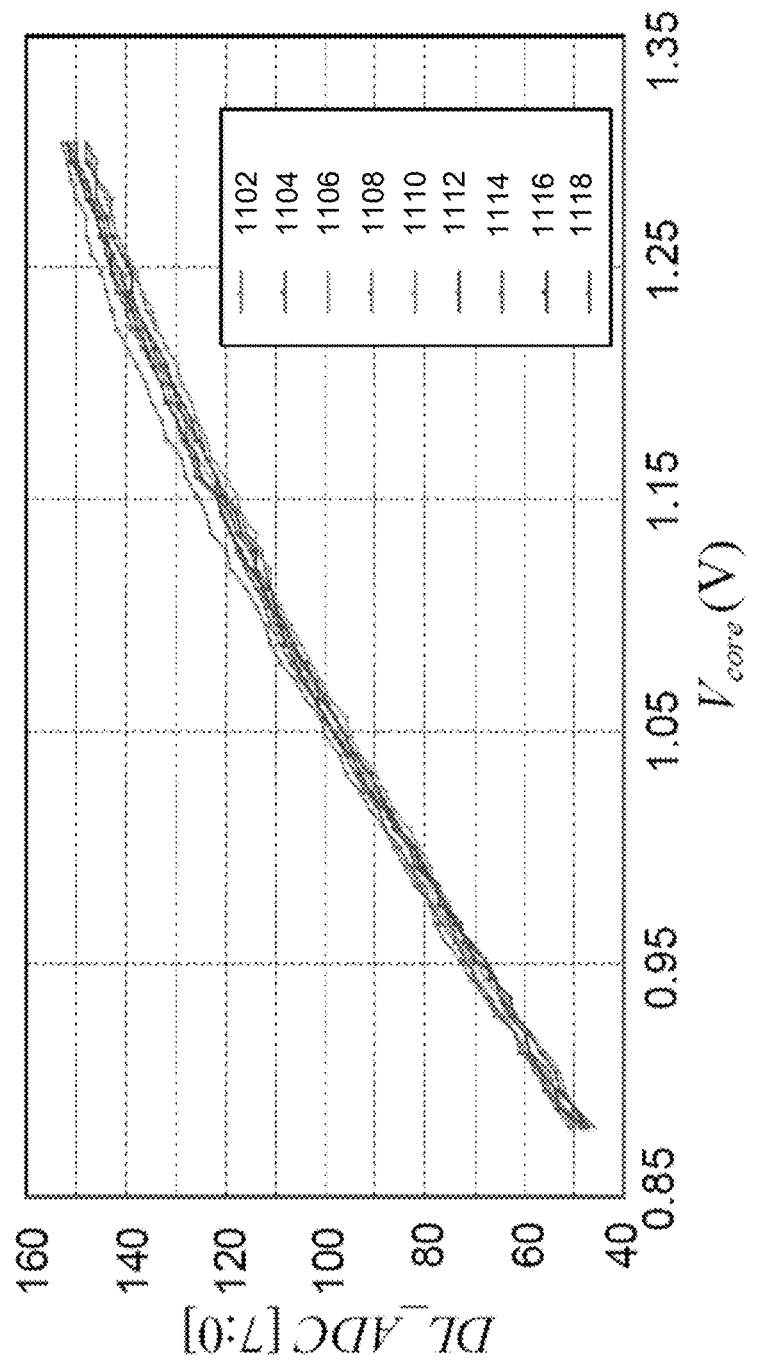
FIG. 11 shows a representation of the measured voltage characteristics for the DL-ADC in all nine modules of FIG. 9.

FIG. 11 shows a representation of the measured voltage characteristics for the DL-ADC in all nine modules of FIG. 9. Each line 1102, 1104, 1106, 1108, 1110, 1112, 1114, 1116, and 1118 corresponds to the DL-ADC of modules 1 through 9, respectively. For clarity, the individual lines are not labelled on the graph. A 5-10% variation in DL_ADC[n] is observed among different DL-ADCs, which is due to process and routing variations across the chip. This variation demonstrates the necessity of calibrating each ADC individually. The measured resolution of the DL-ADC is approximately 4 mV/bit.

The extracted $R_{PDN}$ in all the nine modules at 50° C. is also shown in FIG. 9. A maximum variation of 17% in resistance is observed across the nine modules. The results match with expectations, since the tested Cyclone IV FPGA (EP4CE115F29C7N) has a peripheral wirebond package. The edge of the FPGA die is closer to the bonding wires and therefore has lower resistance. Based on this information, designers can choose to strategically place critical portions of an application in the regions with low RPDN for safe operation.

FIGS. 12A and 12B respectively show a representation of FIR Filter operation with logic errors due to IR-drop and without error due to IR-drop compensation. The IR-drop effect is demonstrated on an FIR filter application, which draws nearly constant power during operation. The output data from the FIR filter is saved and automatically compared with a golden signature at the end of the test, to determine the pass/fail criterion, shown as the Pass Flag signal. The measured failing frequency of the FIR filter's critical path is $f_{sys}=136$ MHz at $V_{core}=0.968$ V. The FIR filter was tested under this condition both with and without the IR-drop voltage compensation, as calculated in accordance with equation (2).

As seen in FIG. 12A, the lack of voltage headroom results in logic error. As seen in FIG. 12B, when incorporating the IR-drop compensation, $V_{comp}$, the dc-dc converter output voltage is set as $V_O=0.968+V_{comp}$, resulting in error-free operation. The worst-case $R_{PDN}=16$ mΩ over full location range is used as the resistance as the critical path in this particular application is not isolated in one location on chip. Note that the irregular ripple in $V_O$ is a result of sampling signal aliasing during the 40 second test.

Figure 13:
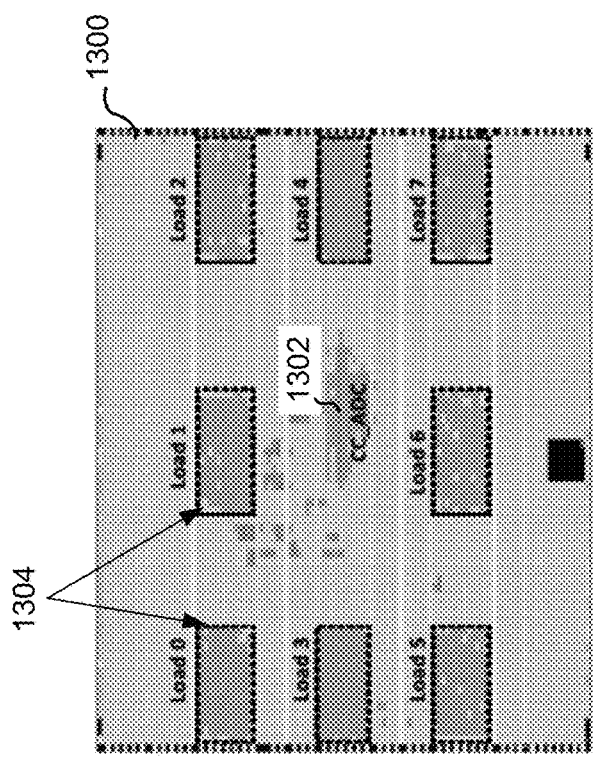
FIG. 13 shows a representation of an on-chip configuration for the AC impedance characterization scheme.

FIG. 13 shows a representation of an on-chip configuration for the AC impedance extraction scheme. The characterization of AC impedance is performed on the same hardware platform with faster sampling enabled by the CC-ADC. The passive components on the PCB in this measurement are those listed in Table 1. Seven load blocks 1304 (only labelled with reference to loads 1 and 2 but applies to all load blocks) are implemented in a chip 1300 around the CC-ADC 1302 to extract the impedance. The programmable load blocks 1304 occupy approximately 20% of the total 114,480 logical elements. Due to the routing limitation of the carry-chain signal, the CC-ADC 1302 has to exploit the logic blocks in one line.

Figure 14:
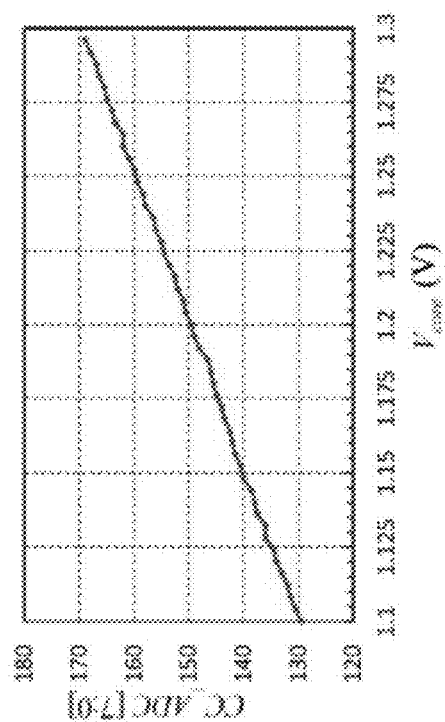
FIG. 14 shows a representation of the measured characteristic of the CC-ADC at 30° C.

FIG. 14 shows a representation of the measured characteristic of the CC-ADC at 30° C. As seen in FIG. 14, the CC-ADC reading, CC_ADC[n] has a monotonic relationship with the core voltage.

Figure 15:
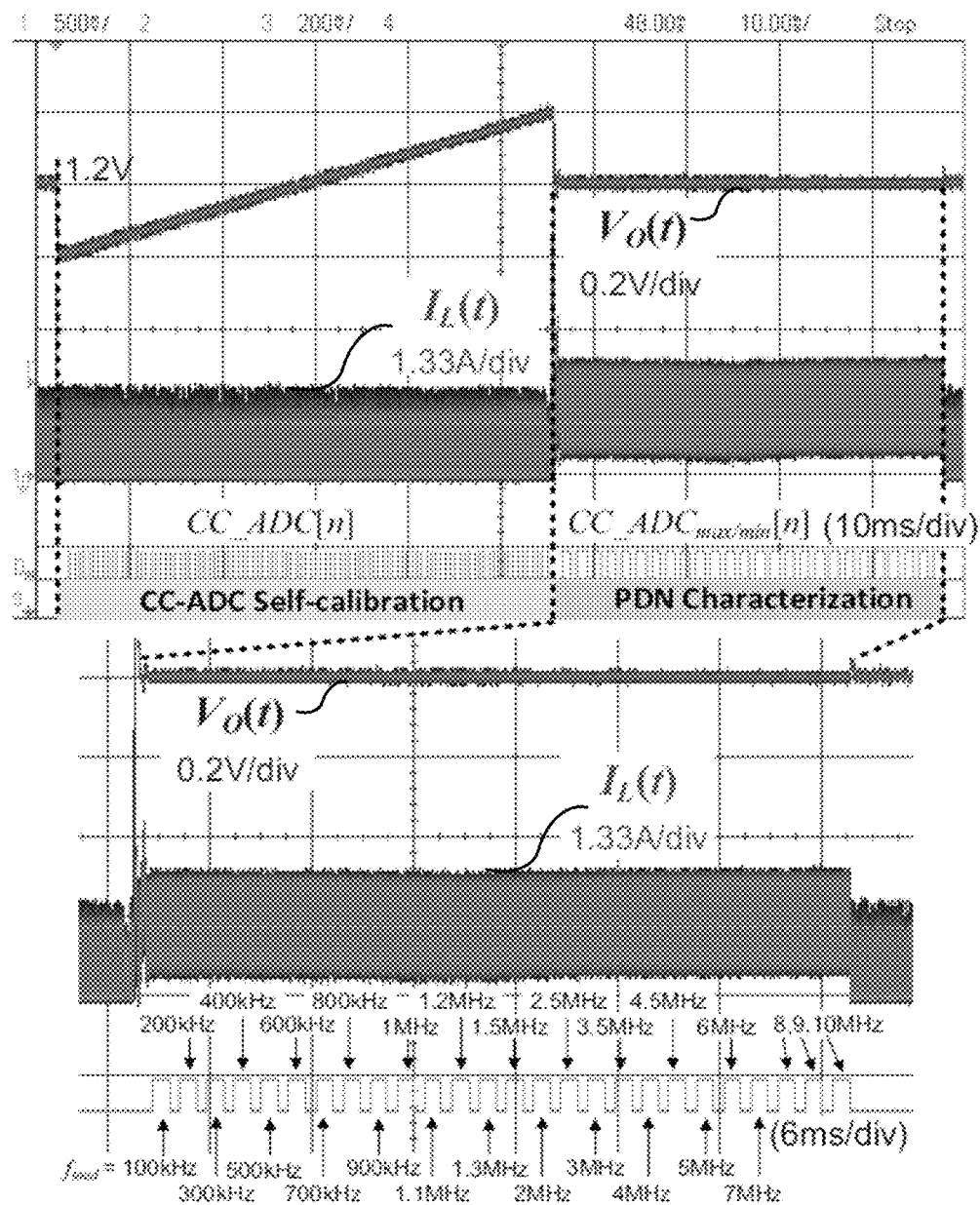
FIG. 15 shows a representation of the measured waveform of the CC-ADC self-calibration and PDN characterization processes.

FIG. 15 shows a representation of the measured waveform of the CC-ADC self-calibration and PDN characterization processes. As seen in FIG. 15, the ADC self-calibration and impedance characterization process is completed within approximately 100 ms.

Due to a limited sampling rate of 75 MHz for the CC-ADC, the maximum frequency of the measurement is $f_{load}=10$ MHz. The starting point of the measurement is set at $f_{load}=100$ kHz, since at lower frequencies the test would interact with the compensator within the VR.

Figure 16A:
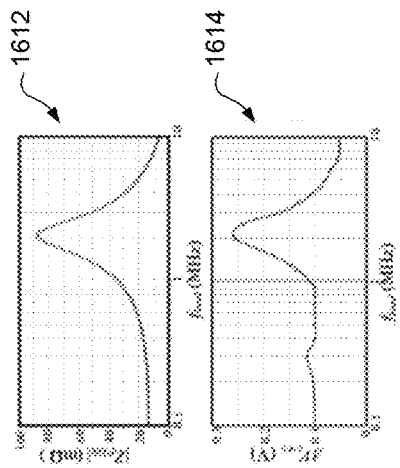
FIGS. 16A through 16D show a representation of simulated PDN impedance compared with testing results under four different PDN configurations.
Figure 16B:
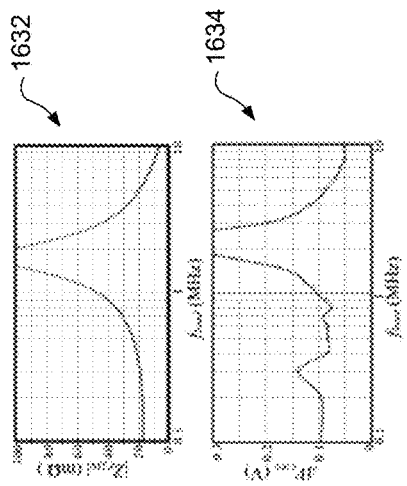
Figure 16C:
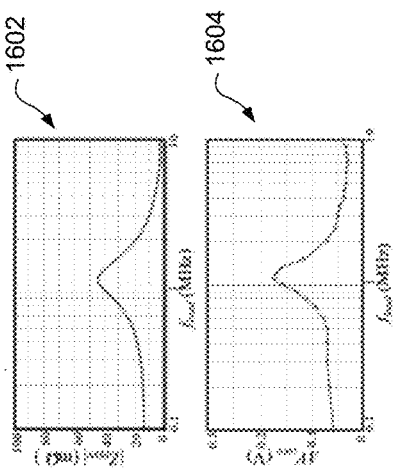
Figure 16D:
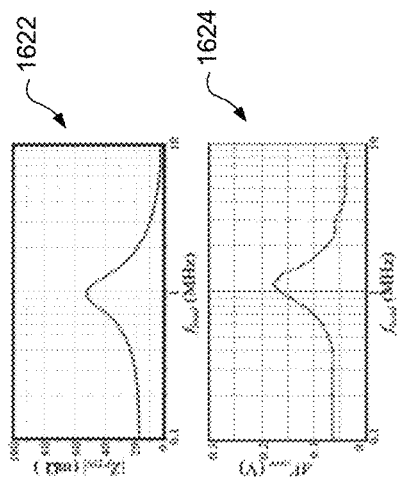

FIGS. 16A through 16D show a representation of simulated PDN impedance compared with testing results under four different PDN configurations. The simulated PDN impedance is shown in the top plots 1602, 1612, 1622, and 1632, in FIGS. 16A-D, and the measured $\Delta V_{core}$ is shown in the bottom plots 1604, 1614, 1624, and 1634. In each case, up to two groups of passive components are de-soldered from the PCB in order to investigate the effect on the PDN. FIG. 16A corresponds to a full PDN configuration having components as listed in table 1; FIG. 16B corresponds to a PDN configuration with eight 0.47 µF capacitors removed; FIG. 16C corresponds to a PDN configuration with two 47 µF capacitors removed; and FIG. 16D corresponds to a PDN configuration with eight 0.47 µF and two 47 µF capacitors removed.

As seen in FIGS. 16A-D, the frequency dependence of $\Delta V_{core}$, obtained from the calibrated CC-ADC output CC_ADC[n], matches well with the simulated impedance magnitude in all four cases. These results demonstrate that the developed method for PDN characterization can be used to experimentally identify the impedance peaks over a broad range of frequencies. The measurements clearly show that a resonance occurs in the 1-2 MHz range when certain decoupling capacitors are missing, which may lead to unacceptably high voltage ripple in the target application, if the load current contains a significant component at this frequency.

A crossbar switch, which is commonly used in telecom applications for routing digital signals, is used to verify the impedance characterization results. The application occupies 24% of the total LEs on chip and operates at 150 MHz. The crossbar switch draws near constant power during normal operation, and a clock gating signal is added such that it operates with a gating frequency $f_{clk\_gating}$. The clock gating signal simulates repetitive reset or a periodic input data stream in the system. The application is tested under different $V_O$, $f_{clk\_gating}$ and PDN component scenarios.

Figure 17A:
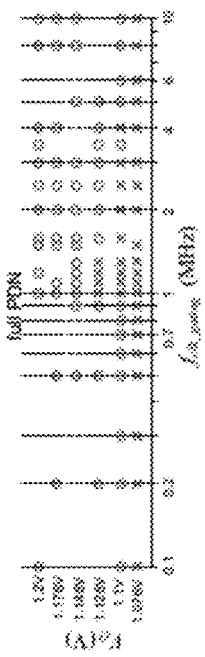
FIGS. 17A through 17C show exemplary pass/fail maps of a crossbar switch application measured at different $V_O$ and $f_{clk\_gating}$ with different PDN scenarios.
Figure 17B:
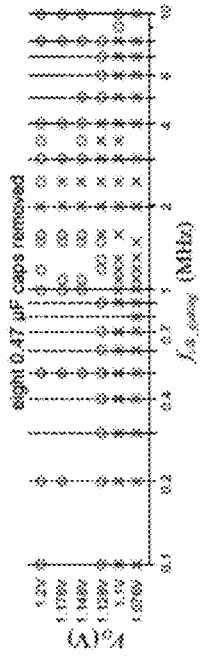
Figure 17C:
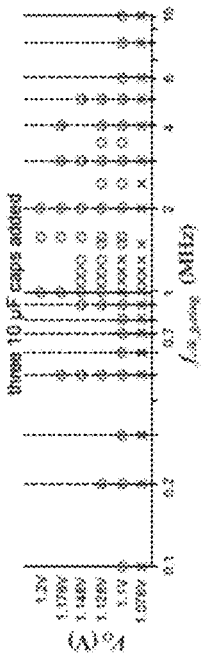

FIGS. 17A through 17C show exemplary pass/fail maps of a crossbar switch application measured at different $V_O$ and $f_{clk\_gating}$ with different PDN scenarios. The distribution of the pass/fail map matches well with the AC impedance characterization results shown in FIGS. 16A and 16B. Note that with only 24% of the total LEs used, the application fails at the nominal 1.2 V at 2 MHz, as demonstrated in FIG. 16B.

Instead of adding voltage headroom for reliable operation like the IR-drop compensation described above, it may be preferable to modify the set of passive components within the PDN to compensate the PDN to damp the impedance peak(s). In FIG. 17C, three 10 µF decoupling capacitors are added to dampen the impedance peak at 1.2 MHz, which can be seen to result in an extension of the error-free operation area.

Figure 18:
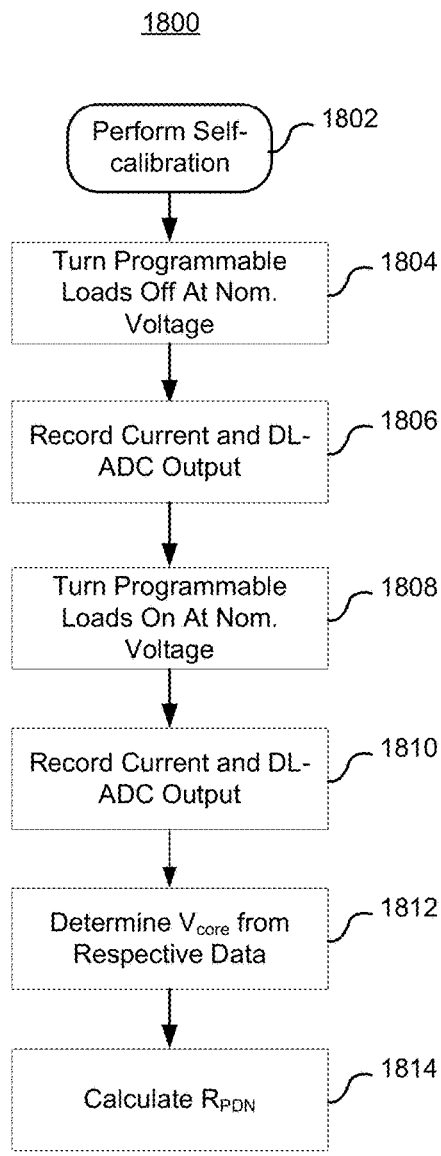
FIG. 18 shows a method of performing DC resistance extraction.

FIG. 18 shows a method of performing DC resistance extraction. One or more modules each comprising a DL-ADC and a programmable load(s) is provided on the FPGA. Self-calibration of the DL-ADC is performed (1802). The self-calibration steps calibrates the DL-ADC so that an output from the DL-ADC corresponds to a core voltage $V_{core}$ in a one-to-one relationship. As described with reference to FIG. 5, the self-calibration may comprise turning off non-relevant circuits and performing a full sweep of $V_O$.

The programmable loads are turned off (1804). This takes place at a nominal voltage, such as $V_O$=1.2 V. The current and the DL-ADC output are recorded (1806) when the programmable loads are turned off. The programmable loads are also turned on (1808) and the current and the DL-ADC output are recorded (1810) when the programmable loads are turned on. A core voltage at the respective times when the programmable loads are turned off and on is determined (1812) based on the recorded data and the results of the self-calibration. The PDN resistance is calculated (1814), for example, using equation (1).

Figure 19:
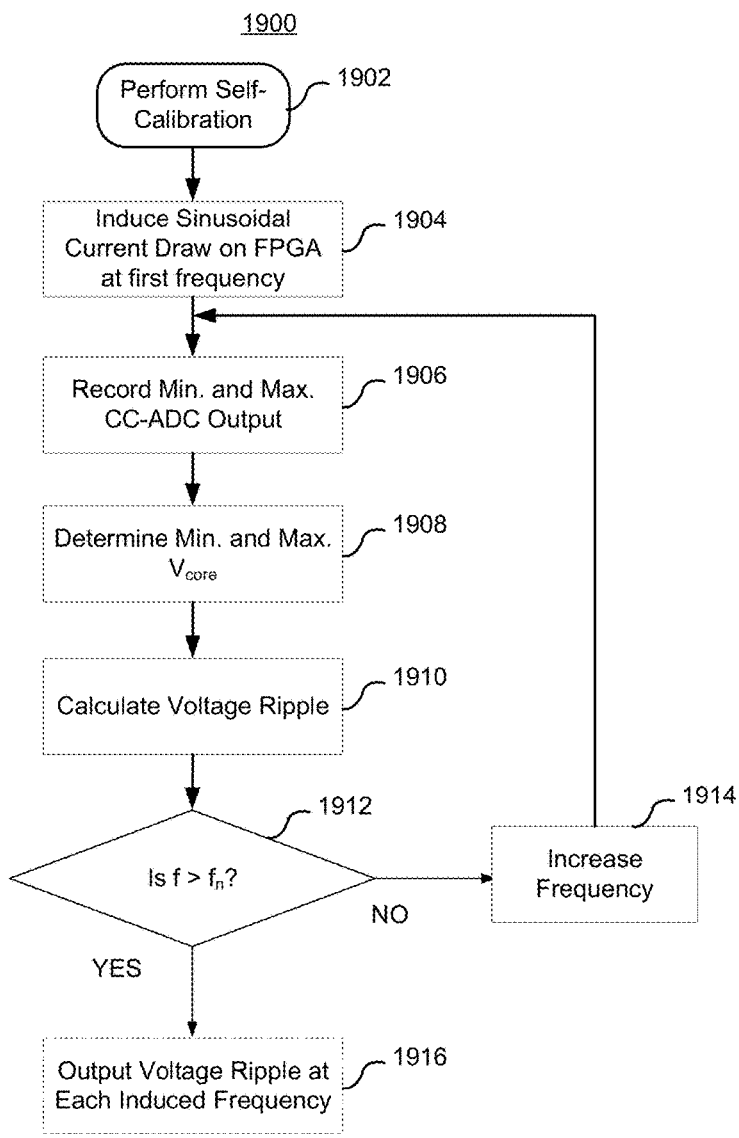
FIG. 19 shows a method of performing AC impedance characterization.

FIG. 19 shows a method of performing AC impedance characterization. A CC-ADC and one or more programmable loads are provided on the FPGA. Self-calibration of the CC-ADC is performed (1902). The self-calibration step calibrates the CC-ADC so that an output from the CC-ADC corresponds to a core voltage $V_{core}$ in a one-to-one relationship. As described with reference to FIG. 7, the self-calibration may be performed based on bandgap reference of the external voltage sensing.

The programmable loads are controlled so that the FPGA draws a sinusoidal current at a first frequency (1904). The minimum and maximum output readings of the CC-ADC are recorded (1906). From the self-calibration, the minimum and maximum core voltage is determined that corresponds to the minimum and maximum output readings of the CC-ADC (1908). A voltage ripple is determined (1910), corresponding to a difference between the maximum and the minimum core voltage. This voltage ripple approximates an impedance of the PDN at the frequency.

A determination is made if the frequency of the current being drawn by the CC-ADC is greater than a predetermined threshold frequency (1912). As previously described, the predetermined threshold frequency may be 8 to 10 times the sampling frequency of the CC-ADC. If the frequency is not greater than the predetermined threshold frequency (NO at 1912), the frequency is increased (1914) and the recording of the minimum and maximum CC-ADC outputs (1906), determination of minimum and maximum core voltage (1908), and determination of the voltage ripple (1910), are performed again at the increased frequency. Once the frequency is greater than the predetermined threshold frequency (YES at 1912), the method ends and the voltage ripple measured at each of the induced frequencies may be output (1916).

In another embodiment of this invention, the novel techniques described above may be applied to perform PDN characterization of a CPU or other digital integrated circuit (IC).

Figure 20:
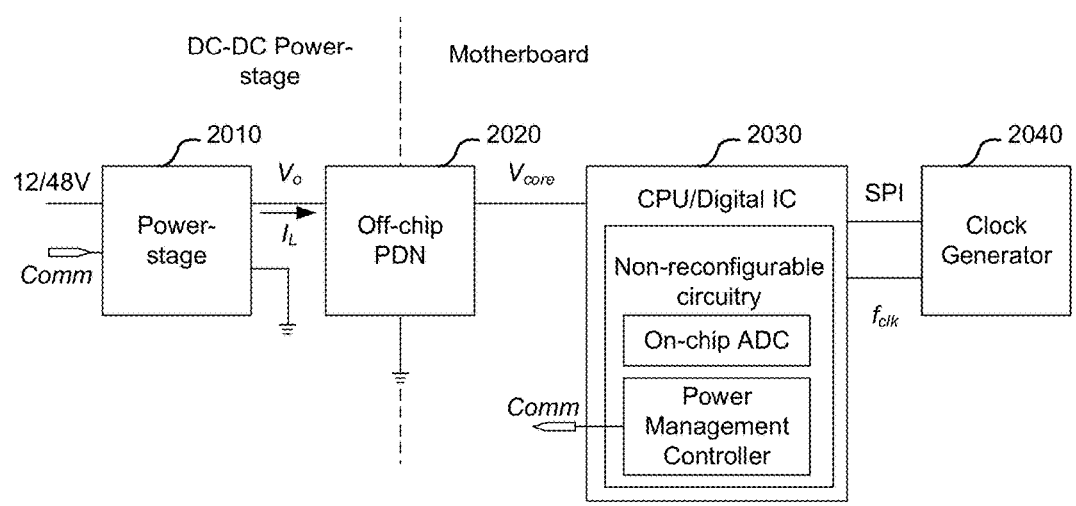
FIG. 20 is a schematic depiction of a system for PDN characterization of a digital integrated circuit.

FIG. 20 depicts a system 2000 for PDN characterization of a CPU or other digital integrated circuit. The system 2000 includes a power-stage 2010, an off-chip PDN 2020, a CPU/digital IC 2030 and a clock generator 2040 connected as shown in this figure.

Figure 21:
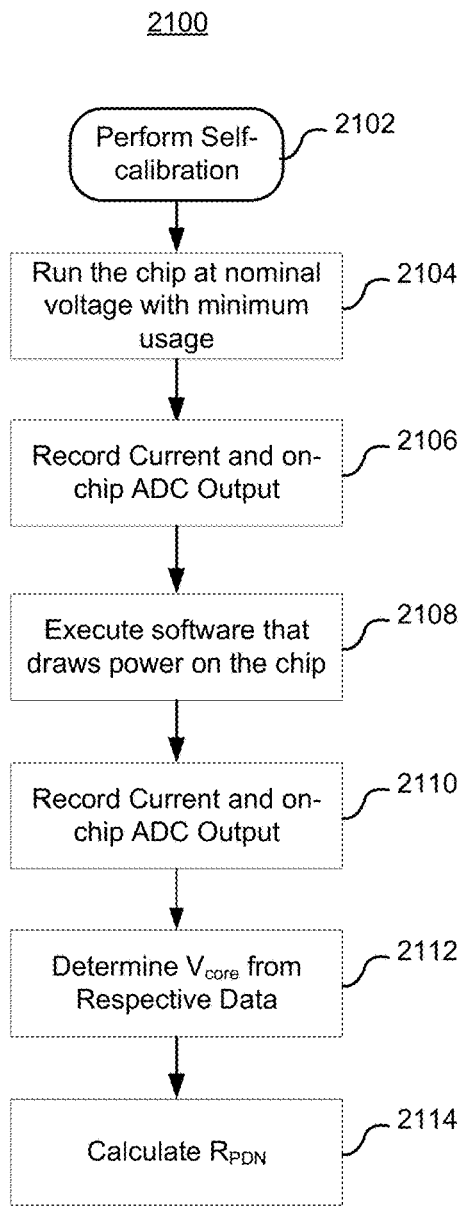
FIG. 21 is a method of performing DC resistance extraction for a digital integrated circuit.

FIG. 21 is a method 2100 of performing DC resistance extraction for a digital integrated circuit. The method entails self-calibration 2102, then running the chip at nominal voltage with minimum usage 2104 and recording the current on-chip ADC output 2106. The method entails executing software that draws power on the chip 2108, and recording the current and on-chip ADC output 2110. The method entails determining the $V_{core}$ from the respective data 2112 and then calculating the resistance ($R_{PDN}$) of the PDN 2114.

Figure 22:
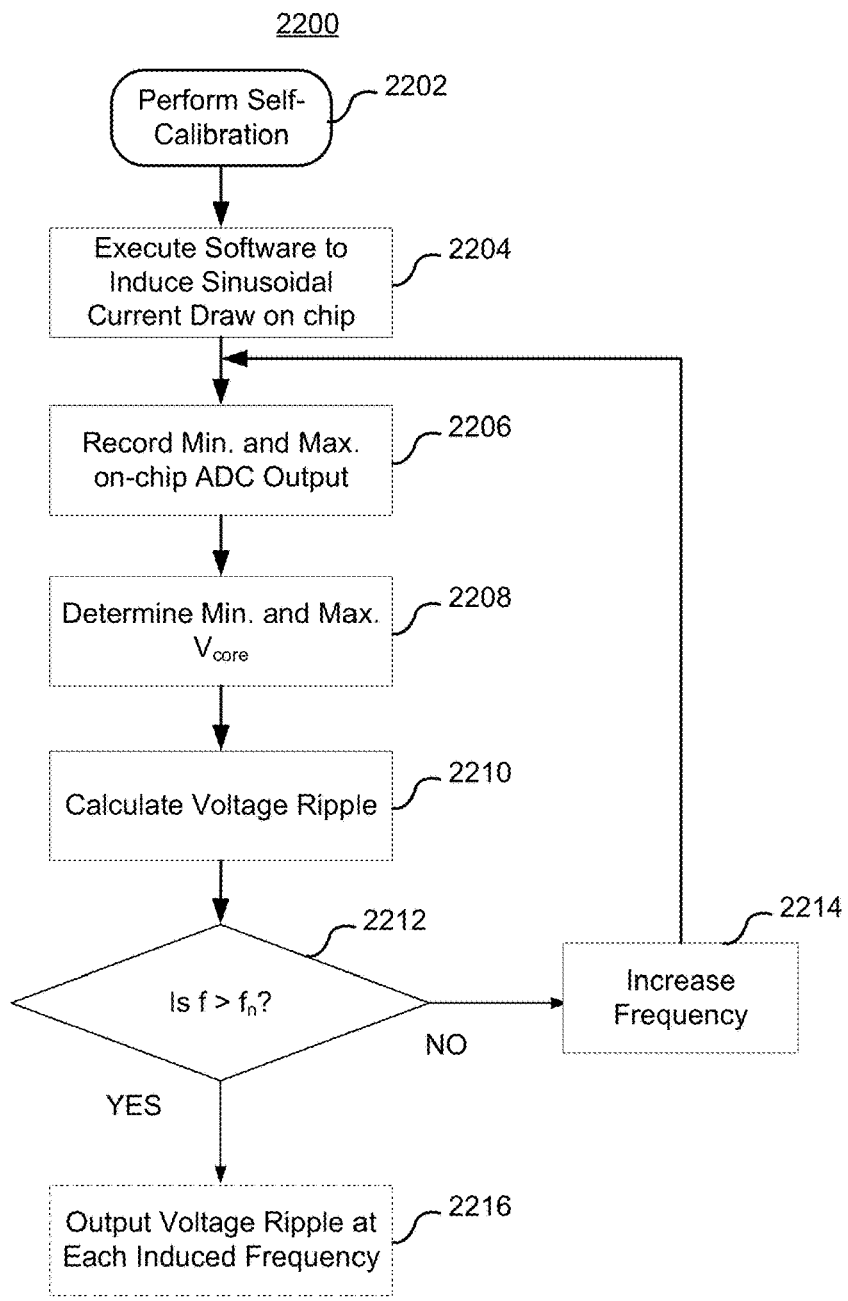
FIG. 22 is a method of performing AC impedance characterization for a digital integrated circuit.

FIG. 22 is a method 2200 of performing AC impedance characterization for a digital integrated circuit. The method 2200 entails self-calibration 2202, then executing software to induce sinusoidal current draw on the chip 2204, recording the minimum and maximum on-chip output 2206, determining the minimum and maximum $V_{core}$ 2208 and then calculating the voltage ripple 2210. A determination is made if the frequency of the current being drawn is greater than a predetermined threshold frequency (2212). If the frequency is not greater than the predetermined threshold frequency (NO at 2212), the frequency is increased (2214) and the recording of the minimum and maximum outputs (2206), determination of minimum and maximum core voltage (2208), and determination of the voltage ripple (2210), are performed again at the increased frequency. Once the frequency is greater than the predetermined threshold frequency (YES at 2212), the method ends and the voltage ripple measured at each of the induced frequencies may be output (2216).

Each element in the embodiments of the present disclosure may be implemented as hardware, software/program, or any combination thereof. Software codes, either in its entirety or a part thereof, may be stored in a computer readable medium or memory (e.g., as a ROM, for example a non-volatile memory such as flash memory, CD ROM, DVD ROM, Blu-Ray™, a semiconductor ROM, USB, or a magnetic recording medium, for example a hard disk). The program may be in the form of source code, object code, a code intermediate source and object code such as partially compiled form, or in any other form.

For the purposes of interpreting this specification, when referring to elements of various embodiments of the present invention, the articles "a", "an", "the" and "said" are intended to mean that there are one or more of the elements. The terms "comprising", "including", "having", "entailing" and "involving", and verb tense variants thereof, are intended to be inclusive and open-ended by which it is meant that there may be additional elements other than the listed elements.

This invention has been described in terms of specific implementations and configurations which are intended to be exemplary only. Persons of ordinary skill in the art will appreciate that many obvious variations, refinements and modifications may be made without departing from the inventive concepts presented in this application. The scope of the exclusive right sought by the Applicant(s) is therefore intended to be limited solely by the appended claims. It would be appreciated by one of ordinary skill in the art that the system and components shown in the figures may include components not shown in the drawings. It will be apparent to persons skilled in the art that a number of variations and modifications can be made without departing from the scope of the invention as defined in the claims.

The invention claimed is:

1. A method of determining an impedance of a Power Delivery Network (PDN) of a Field-Programmable Gate Array (FPGA), comprising:
   performing a calibration of a Carry-Chain Analog-to-Digital Converter (CC-ADC) to calibrate an output of the CC-ADC to correspond with a core voltage of the FPGA;
   controlling one or more programmable loads on the FPGA such that a current draw in the CC-ADC is approximately sinusoidal at a first frequency;
   recording a minimum and a maximum output of the CC-ADC at the first frequency;
   determining a minimum and a maximum core voltage based on the minimum and the maximum output of the CC-ADC in accordance with the calibration; and
   calculating a voltage ripple based on the difference between the maximum core voltage and the minimum core voltage,
   wherein the voltage ripple approximates the impedance of the PDN at the first frequency.

2. The method of claim 1, further comprising outputting the voltage ripple at the first frequency.

3. The method of claim 1, further comprising:
   controlling the one or more programmable loads such that the current draw in the FPGA is approximately sinusoidal at one or more additional frequencies, each of the additional frequencies greater than the first frequency and less than or equal to a predetermined maximum frequency; and
   at each respective frequency of the one or more additional frequencies, the method further comprises:
   recording a minimum and a maximum output of the CC-ADC at the respective frequency;
   determining a minimum and a maximum core voltage at the respective frequency based on the minimum and the maximum output of the CC-ADC in accordance with the calibration; and
   determining a voltage ripple at the respective frequency based on the difference between the maximum core voltage and the minimum core voltage.

4. The method of claim 3, further comprising:
   outputting the voltage ripple at each of the one or more additional frequencies.

5. The method of claim 3, wherein the sampling frequency of the CC-ADC is at least 8 to 10 times of the predetermined maximum frequency.

6. The method of claim 1, wherein the calibration of the CC-ADC is performed using a bandgap reference of an external voltage sensing.

7. The method of claim 1, wherein the output of the CC-ADC is in binary.

8. The method of claim 7, wherein the CC-ADC comprises an encoder to encode a thermometer code output into binary.

9. A system for determining an impedance of a Power Delivery Network (PDN) of a Field-Programmable Gate Array (FPGA), comprising:
   a Carry-Chain Analog-to-Digital Converter (CC-ADC), comprising:
   a plurality of carry-chain adders configured to receive a modulating input; and
   an encoder configured to encode an output of the carry-chain adders into binary;
   one or more programmable loads; and
   a frequency generator configured to control the one or more programmable loads so that a current draw of the CC-ADC is sinusoidal at a plurality of frequencies.

10. The system of claim 9, wherein the CC-ADC and the one or more programmable loads are disposed on the FPGA during testing.

11. The system of claim 10, wherein the CC-ADC is implemented as a line of logical elements on the FPGA.

12. The system of claim 10, wherein the one or more programmable loads are disposed around the CC-ADC.

13. The system of claim 9, wherein the CC-ADC comprises 256 adders.

14. The system of claim 9, wherein the CC-ADC comprises an encoder to encode a thermometer code output into binary.

15. The system of claim 9, wherein the one or more programmable loads each comprise three inverter chains, each inverter chain configured to be controlled with an enable signal from the frequency generator.

16. The method of claim 2, further comprising:
   controlling the one or more programmable loads such that the current draw in the FPGA is approximately sinusoidal at one or more additional frequencies, each of the additional frequencies greater than the first frequency and less than or equal to a predetermined maximum frequency; and
   at each respective frequency of the one or more additional frequencies, the method further comprises:
   recording a minimum and a maximum output of the CC-ADC at the respective frequency;
   determining a minimum and a maximum core voltage at the respective frequency based on the minimum and the maximum output of the CC-ADC in accordance with the calibration; and
   determining a voltage ripple at the respective frequency based on the difference between the maximum core voltage and the minimum core voltage.

17. The method of claim 4, wherein the sampling frequency of the CC-ADC is at least 8 to 10 times of the predetermined maximum frequency.

18. The method of claim 2, wherein the calibration of the CC-ADC is performed using a bandgap reference of an external voltage sensing.

19. The system of claim 11, wherein the one or more programmable loads are disposed around the CC-ADC.

* * * * *